United States Patent [19]
Nagashima et al.

[11] 3,953,662
[45] Apr. 27, 1976

[54] SEALED CONTAINER HOUSING A MECHANICAL FILTER

[75] Inventors: Toshio Nagashima; Ichiro Imaguchi; Shigeo Igarashi, all of Tokyo, Japan

[73] Assignee: Kokusai Electric Co., Ltd., Tokyo, Japan

[22] Filed: Dec. 30, 1974

[21] Appl. No.: 537,313

Related U.S. Application Data
[62] Division of Ser. No. 472,987, May 24, 1974.

[30] Foreign Application Priority Data
June 11, 1973 Japan.............................. 48-65589
June 11, 1973 Japan.............................. 48-65590
June 11, 1973 Japan.............................. 48-65591
June 15, 1973 Japan......................... 48-70837[U]

[52] U.S. Cl........................... 174/17.05; 174/52 R; 310/8.2; 333/71
[51] Int. Cl.²........................................... H05K 5/06
[58] Field of Search ............. 174/50.5, 50.54, 52 S, 174/17.05, 17.07; 333/71, 72; 357/74; 310/25, 8.2; 206/232, 233

[56] References Cited
UNITED STATES PATENTS

| | | | |
|---|---|---|---|
| 2,810,889 | 10/1957 | Lundgren ...................... | 174/52 S X |
| 2,838,722 | 6/1958 | Watson............................ | 357/74 U |
| 3,076,153 | 1/1963 | Reickman et al................ | 333/71 X |
| 3,795,831 | 5/1974 | Fujita.............................. | 310/8.2 X |

*Primary Examiner*—Darrell L. Clay

[57] ABSTRACT

A container for a mechanical filter is provided in which the internal pressure is reduced to prevent propagation in the air of sound waves to thereby prevent deterioration of the filter characteristics. A recess with an aperture therethrough is formed in one of the walls of a metal casing which constitutes the container. Further, an adhesive tape-like member is disposed on the surface of the recess in such a manner as to cover the aperture. After the casing has been evacuated through the aperture, hermetic sealing means is provided on the adhesive tape-like member within the recess.

3 Claims, 2 Drawing Figures

SEALED CONTAINER HOUSING A MECHANICAL FILTER

This is a division of application Ser. No. 472,987, filed May 24, 1974.

This invention relates to a container for a mechanical filter such as of the type which comprises a pair electro-mechanical transducer elements and a coupling member connecting said transducer elements, wherein one or more mechanical resonator elements may be provided between said transducer elements and connected to each other and to said transducer elements through said coupling member.

It is an object of the present invention to provide a container for mechanical filter in which the internal pressure is reduced to prevent propagation in the air of sound waves to thereby prevent deterioration of the filter characteristic which would otherwise result from the sound waves being reflected by the inner walls of the container, and particularly, such a container which permits such pressure-reduction to be achieved simply and reliably and enables effective hermetic sealing to be realized.

Other objects, advantages and features of the present invention will become apparent from the following detailed description taken in conjunction with the accompanying drawings.

Figure 1:
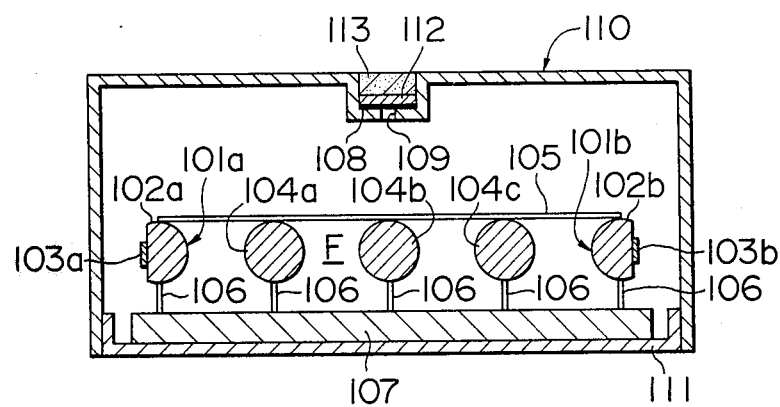
FIG. 1 is a schematic cross-sectional view of the container according to a further embodiment of the present invention and also showing the mechanical filter contained therein.

Referring to FIG. 1, an embodiment of the mechanical filter container according to the present invention is shown in connection with the manner in which its pressure-reduction and hermetic sealing is effected. In FIG. 1, the container accommodater an example of mechanical filter wherein there are provided input and output side electro-mechanical transducers 101a and 101b which respectively comprise resonators 102a and 102b of truncated circular cross-section capable of flexural mode resonance and piezoelectric ceramic plates 103a and 103b attached thereto. Disposed between these transducers 101a and 101b are round rod-like flexural mode resonators 104a, 104b and 104c. The transducers and the resonators are mechanically cascade-connected by a coupler 105. The electro-mechanical transducers 101a, 101b and the resonators 104a, 104b, 104c are mounted on a mount base plate 107 such as printed base plate by means of support wires 106. A mechanical filter thus formed by the above-described components is generally designated by F.

In this embodiment, an open-bottomed box-like member 110 is prepared which has a recess 108 formed in the top wall and provided with a through-aperture 109, and the box-like member 110 is hermetically fitted to the bottom wall 111 to which is adhesively or otherwise secured the base plate 107 having the above-described mechanical filter F mounted thereon. A sheet 112, for example, of one-side or both-side adhesive vinyl tape, is attached to the recess 108 so as to cover the through-aperture 109.

The box-like member 110 now with the mechanical filter F contained therein is disposed within a pressure-reducing kiln (not shown) connected to a vacuum pump through a cock or like opening-closing means, and then the pressure in the kiln is reduced to a predetermined value by the vacuum pump. This causes the air within the box-like member 10 to be drawn from the aperture 109 through a clearance between the sheet 112 and the surface of the recess in the box 110, so that the internal pressure of the box 110 assumes the same level as that within the kiln. When the cock is opened to momentarily admit the air into the kiln, the pressure of such air urges the sheet 112 into contact with the surface of the recess 108 in the box, thus providing complete sealing of the aperture 109. To provide and maintain further complete sealing of the aperture, a sealing material 113 such as silicone, epoxy or the like may be introduced into the recess 108 from above the sheet 112. Since the through-aperture is formed through the bottom of the recess 108 and such recess is filled with the sealing material 113, it may be avoided that the sealing material bulges outwardly of the major top surface of the box 110 to increase the outside dimensions of that portion. Thus, the pressure reduction and hermetic sealing of the mechanical filter may be achieved by a simple construction, whereby deterioration of the filter characteristic may be effectively prevented.

Figure 2:
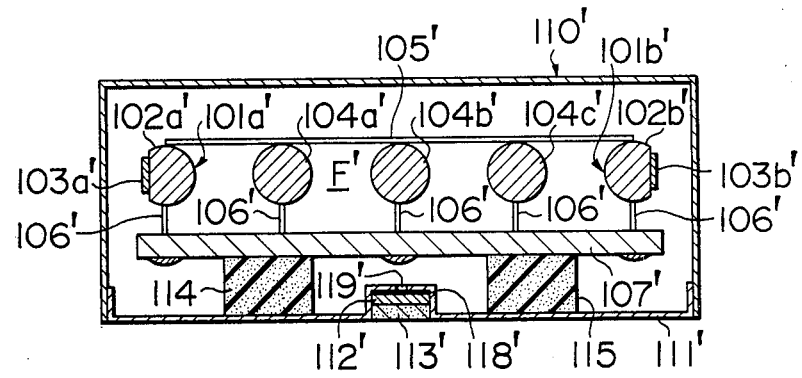
FIG. 2 is a view similar to FIG. 1 but showing a modification to the FIG. 1 embodiment.

FIG. 2 shows a modification of the FIG. 1 embodiment. It is similar to the embodiment of FIG. 1 except that a recess 118' is formed in the bottom wall 111' of a box 110' and that a base plate 107' rests on a pair of support members 114 and 115 on the bottom wall 111', which support members may be formed of a shock-absorbing material such as rubber, sponge or the like.

While the invention has been shown and described with respect to some specific embodiments, it should be understood that the invention is not restricted to such embodiments but includes all changes and modifications which will fall within the spirit and scope of the invention as defined in the appended claims.

What is claimed is:

1. A container housing a mechanical filter, comprising a metal casing having top, bottom and end walls accommodating a mechanical filter therein; a recess formed in one of the walls of said metal casing and provided with an aperture therethrough; adhesive means disposed on the surface of said recess in such a manner as to cover said aperture, said adhesive means being adapted to permit the air within said casing to be withdrawn from said casing through said aperture and through a clearance between said adhesive means and the surface of said recess so that said casing may be evacuated, said adhesive means being also adapted to be urged into air-tight contact with the surface of said recess to hermetically seal said aperture due to the difference in pressure between the outside and the inside of said casing after the latter has been evacuated; and hermetic sealing means provided on said adhesive means within said recess after said casing has been evacuated.

2. A container according to claim 1, wherein said recess is formed in the top wall of said casing.

3. A container according to claim 1, wherein said recess is formed in the bottom wall of said casing.

* * * * *